United States Patent
Sugimoto et al.

(10) Patent No.: US 9,614,071 B2
(45) Date of Patent: Apr. 4, 2017

(54) SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Masahiro Sugimoto, Toyota (JP); Yuichi Takeuchi, Obu (JP)

(73) Assignees: TOYOTA JIDOSHA KABUSHIKI KAISHA, Toyota (JP); DENSO CORPORATION, Kariya-shi (JP)

( * ) Notice: Subject to any disclaimer, the term of this patent is extended or adjusted under 35 U.S.C. 154(b) by 0 days.

(21) Appl. No.: 14/262,121

(22) Filed: Apr. 25, 2014

(65) Prior Publication Data
US 2014/0339569 A1 Nov. 20, 2014

(30) Foreign Application Priority Data

May 17, 2013 (JP) ................................. 2013-104838

(51) Int. Cl.
| H01L 29/94 | (2006.01) |
| H01L 29/78 | (2006.01) |
| H01L 29/06 | (2006.01) |
| H01L 29/08 | (2006.01) |
| H01L 29/10 | (2006.01) |
| H01L 29/16 | (2006.01) |

(52) U.S. Cl.
CPC ...... *H01L 29/7813* (2013.01); *H01L 29/0623* (2013.01); *H01L 29/0878* (2013.01); *H01L 29/1095* (2013.01); *H01L 29/1608* (2013.01)

(58) Field of Classification Search
CPC ............. H01L 29/7813; H01L 29/0623; H01L 29/0878; H01L 29/1095; H01L 29/1608
See application file for complete search history.

(56) References Cited

U.S. PATENT DOCUMENTS

| 2002/0158251 | A1 | 10/2002 | Takahashi et al. | |
| 2004/0016959 | A1* | 1/2004 | Yamaguchi et al. | 257/327 |
| 2007/0187695 | A1* | 8/2007 | Nakamura et al. | 257/77 |
| 2009/0114969 | A1* | 5/2009 | Suzuki | H01L 29/0619 257/301 |
| 2011/0254010 | A1* | 10/2011 | Zhang | 257/66 |

FOREIGN PATENT DOCUMENTS

| JP | A-2002-329670 | 11/2002 |
| JP | A-2009-194065 | 8/2009 |
| JP | 2012-169385 A | 9/2012 |
| WO | 2012/108165 A1 | 8/2012 |

* cited by examiner

*Primary Examiner* — Earl Taylor
*Assistant Examiner* — Samuel Park
(74) *Attorney, Agent, or Firm* — Oliff PLC

(57) ABSTRACT

A semiconductor device formed on a silicon carbide substrate that has a front surface on which an electrode is provided and a back surface on which an electrode is provided includes a drain layer, a drift layer, a base layer, a gate electrode that is located in a trench that extends from the front surface into the drift layer and is insulated by an insulating film, a source layer, a buried layer that is provided between the drift layer and the base layer and is formed such that the depth from the front surface to an end thereof on the side of the drift layer is greater than the depth from the front surface to a distal end of the trench, and a first epitaxial layer that is provided between the buried layer and the base layer and has a higher impurity concentration than the buried layer.

5 Claims, 4 Drawing Sheets

SEMICONDUCTOR DEVICE

INCORPORATION BY REFERENCE

The disclosure of Japanese Patent Application No. 2013-104838 filed on May 17, 2013 including the specification, drawings and abstract is incorporated herein by reference in its entirety.

BACKGROUND OF THE INVENTION

1. Field of the Invention

The present invention relates to a semiconductor device.

2. Description of Related Art

In Japanese Patent Application Publication No. 2009-194065 (JP 2009-194065 A), a semiconductor device that is formed in a silicon carbide substrate that has a front surface on which a front surface electrode is provided and a back surface on which a back surface electrode is provided is disclosed. The semiconductor device includes a drain layer of a first conductivity-type that is electrically connected to the back surface electrode, a drift layer of a first conductivity-type that is placed on the side of the front surface of the silicon carbide substrate relative to the drain layer and has a lower impurity concentration than the drain layer, a base layer of a second conductivity-type that is placed on the side of the front surface of the silicon carbide substrate relative to the drift layer and is electrically connected to the front surface electrode, a gate electrode that is located in a trench that extends from the front surface of the silicon carbide substrate into the drift layer and is insulated from the silicon carbide substrate and the front surface electrode by an insulating film, a source layer of a first conductivity-type that is provided between the base layer and the front surface electrode and is in contact with the insulating film for the gate electrode and the front surface electrode, and a buried layer of a second conductivity-type that is provided between the drift layer and the base layer and is formed such that the depth of its drift layer side end from the front surface of the silicon carbide substrate is greater than the depth of a distal end of the trench from the front surface of the silicon carbide substrate.

In the above semiconductor device, when a voltage is applied between the gate electrode and the front surface electrode as a source electrode, an N-type channel is formed in an area of the base layer in contact with the gate insulating film. When a voltage is applied between the back surface electrode as a drain electrode and the front surface electrode as a source electrode in this state, a large current flows from the back surface electrode toward the front surface electrode. The magnitude of the current that flows at this time depends on the magnitude of the voltage between the gate electrode and the front surface electrode. In other words, the above semiconductor device functions as a trench-gate type N-channel vertical MOSFET.

In the above semiconductor device, a buried layer is formed between the drift layer and the base layer, and the depth from the front surface of the silicon carbide substrate to the drift layer side end of the buried layer is greater than the depth from the front surface of the silicon carbide substrate to a distal end of the trench. With this configuration, electric field strength in the vicinity of the distal end of the trench that may occur when a voltage is applied can be relaxed. This improves the voltage resistance of the semiconductor device.

The semiconductor device as described above is produced by the following procedure. First, a drain layer and a drift layer are formed in a silicon carbide substrate, and ion-implantation is performed into the front surface of the drift layer to form a buried layer. Then, a base layer is formed on the front surface of the buried layer by epitaxial growth, and ion-implantation is performed into the front surface of the base layer to form a source layer. In addition, a trench is formed from the front surface of the silicon carbide substrate, and a gate electrode is formed in the trench. Then, a front surface electrode and a back surface electrode are formed on the front surface and the back surface, respectively, of the silicon carbide substrate.

When a buried layer is formed by ion-implantation as described above, the buried layer suffers from minute defects, such as threading dislocation. When epitaxial growth is used to form a base layer on the front surface of the buried layer as described above, the defects of the buried layer may be transferred to the base layer and the base layer may also suffer from the same defects as those of the buried layer. When the base layer has defects, a leak current is generated when a voltage is applied between the drain and the source.

SUMMARY OF THE INVENTION

The present invention provides a technique by which, in a semiconductor device that is formed in a silicon carbide substrate and has a buried layer between a drift layer and a base layer, the transfer of defects of the buried layer to the base layer can be reduced.

A semiconductor device that is formed on a silicon carbide substrate that has a front surface on which a front surface electrode is provided and a back surface on which a back surface electrode is provided according to an aspect of the present invention includes a drain layer of a first conductivity-type that is electrically connected to the back surface electrode; a drift layer of a first conductivity-type that is placed on the side of the front surface of the silicon carbide substrate relative to the drain layer and has a lower impurity concentration than the drain layer; a base layer of a second conductivity-type that is placed on the side of the front surface of the silicon carbide substrate relative to the drift layer and is electrically connected to the front surface electrode; a gate electrode that is placed in a trench that extends from the front surface of the silicon carbide substrate into the drift layer and is insulated from the silicon carbide substrate and the front surface electrode by an insulating film; a source layer of a first conductivity-type that is provided between the base layer and the front surface electrode and is in contact with the insulating film for the gate electrode and the front surface electrode; a buried layer of a second conductivity-type that is provided between the drift layer and the base layer, and is formed such that the depth from the front surface of the silicon carbide substrate to an end thereof on the side of the drift is greater than the depth from the front surface of the silicon carbide substrate to a distal end of the trench; and a first epitaxial layer that is provided between the buried layer and the base layer, and has a higher impurity concentration than the buried layer.

According to the above aspect, the generation of a leak current that may occur when a voltage is applied between the drain and source can be prevented.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
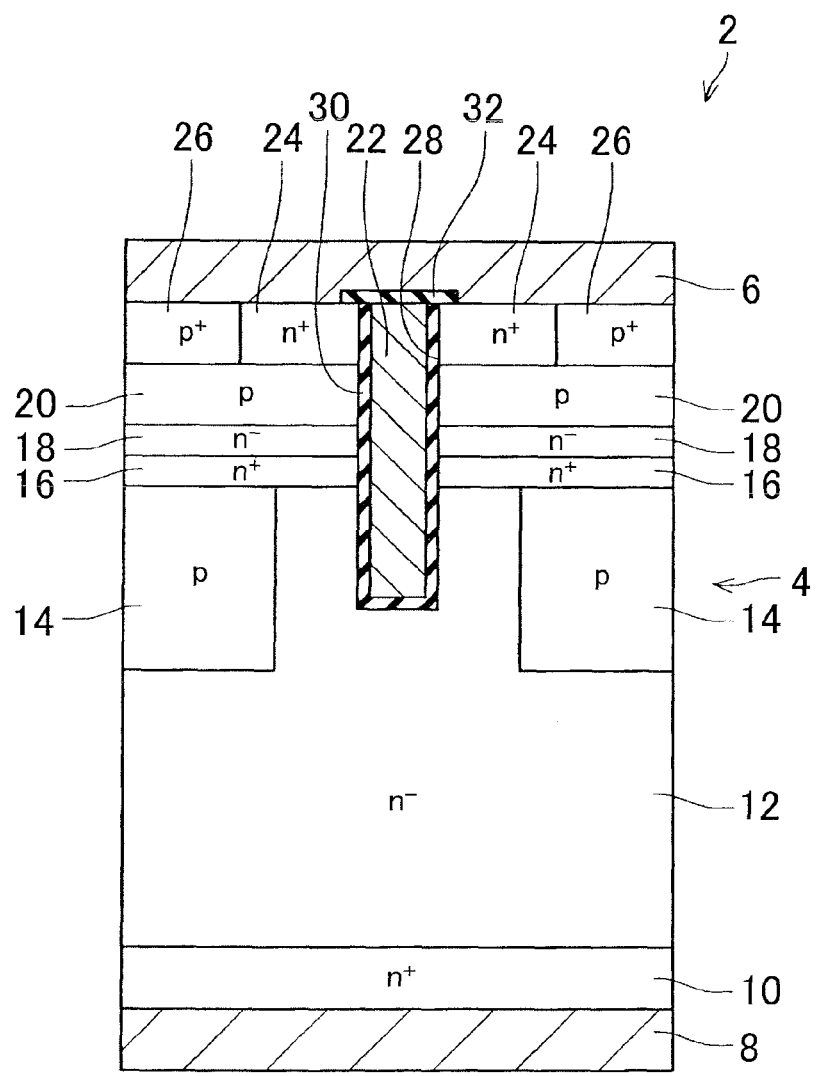
FIG. 1 is a cross-sectional view that schematically illustrates an essential part of a semiconductor device.

As shown in FIG. 1, a semiconductor device 2 is formed in a silicon carbide substrate 4. The silicon carbide substrate 4 has a front surface on which a front surface electrode 6 is provided and a back surface on which a back surface electrode 8 is provided.

The semiconductor device 2 includes a drain layer 10, a drift layer 12, a buried layer 14, a first epitaxial layer 16, a second epitaxial layer 18, a base layer 20, a gate electrode 22, a source layer 24, and a contact layer 26.

The drain layer 10 is composed of an n-type silicon carbide that has a high impurity concentration. The drain layer 10 is exposed on the back surface of the silicon carbide substrate 4, and is in contact with the back surface electrode 8. In other words, the drain layer 10 is electrically connected to the back surface electrode 8.

The drift layer 12 is composed of an n-type silicon carbide that has a lower impurity concentration than the drain layer 10. The drift layer 12 is placed on the side of the front surface of the silicon carbide substrate 4 relative to the drain layer 10.

The buried layer 14 is composed of a p-type silicon carbide. The buried layer 14 is formed partially in the surface of the drift layer 12 on the side of the front surface of the silicon carbide substrate 4. The buried layer 14 is formed by ion-implantation into apart of the surface of the drift layer 12.

The first epitaxial layer 16 is composed of an n-type silicon carbide that has a higher impurity concentration than the buried layer 14. The first epitaxial layer 16 is formed by epitaxial growth of an n-type silicon carbide after the buried layer 14 is formed in the front surface of the drift layer 12.

The second epitaxial layer 18 is composed of an n-type silicon carbide that has a lower impurity concentration than the first epitaxial layer 16. The second epitaxial layer 18 is placed on the side of the front surface of the silicon carbide substrate 4 relative to the first epitaxial layer 16. The second epitaxial layer 18 is formed by epitaxial growth of an n-type silicon carbide after the first epitaxial layer 16 is formed.

The base layer 20 is composed of a p-type silicon carbide. The base layer 20 is placed on the side of the front surface of the silicon carbide substrate 4 relative to the second epitaxial layer 18. The base layer 20 is formed by epitaxial growth of a p-type silicon carbide after the second epitaxial layer 18 is formed.

The gate electrode 22 is located in a trench 28. The trench 28 extends from the front surface of the silicon carbide substrate 4 through the base layer 20, the second epitaxial layer 18 and the first epitaxial layer 16 into the drift layer 12. The depth from the front surface of the silicon carbide substrate 4 to the distal end of the trench 28 is smaller than the depth from the front surface of the silicon carbide substrate 4 to the back surface side (the drift layer 12 side) end of the buried layer 14. The gate electrode 22 is insulated from the silicon carbide substrate 4 by a gate insulating film 30 and from the front surface electrode 6 by a front surface insulating film 32. The gate electrode 22 is electrically connected to a gate electrode terminal (not shown).

The source layer 24 is composed of an n-type silicon carbide that has a high impurity concentration. The source layer 24 is placed between the base layer 20 and the front surface electrode 6 and is in contact with the gate insulating film 30 for the gate electrode 22 and the front surface electrode 6. The source layer 24 is formed by ion-implantation into a part of the front surface of the base layer 20 after the base layer 20 is formed.

The contact layer 26 is composed of a p-type silicon carbide that has a higher impurity concentration than the base layer 20. The contact layer 26 is placed between the base layer 20 and the front surface electrode 6, and is in contact with the front surface electrode 6. The contact layer 26 is formed by ion-implantation into a part of the front surface of the base layer 20 after the base layer 20 is formed.

When a voltage is applied between the gate electrode 22 and the front surface electrode 6 as a source electrode, an N-type channel is formed in an area of the base layer 20 in contact with the gate insulating film 30. When a voltage is applied between the back surface electrode 8 as a drain electrode and the front surface electrode 6 as a source electrode in this state, a large current flows from the back surface electrode 8 toward the front surface electrode 6. The magnitude of the current that flows at this time depends on the magnitude of the voltage that is applied between the gate electrode 22 and the front surface electrode 6. In other words, the semiconductor device 2 functions as a trench gate-type N-channel vertical MOSFET.

In the semiconductor device 2 of this embodiment, a buried layer 14 is formed between the drift layer 12 and the base layer 20, and the depth from the front surface of the silicon carbide substrate 4 to the back surface side (the drift layer 12 side) end of the buried layer 14 is greater than the depth from the front surface of the silicon carbide substrate 4 to a distal end of the trench 28. With this configuration, electric field strength in the vicinity of the distal end of the trench 28 that may occur when a voltage is applied can be relaxed. This improves the voltage resistance of the semiconductor device 2.

Typically, in the process of producing the semiconductor device 2, the buried layer 14 is formed by ion-implantation into the front surface of the drift layer 12, and minute defects, such as threading dislocation, occur in the buried layer 14 during the ion-implantation. When epitaxial growth is used to form the base layer 20 on the front surface of the buried layer 14 as in a conventional art, the defects of the buried layer 14 may be transferred to the base layer 20 and the base layer 20 may also suffer from the same defects as those of the buried layer 14. When the base layer 20 has defects, a leak current is generated when a voltage is applied between the drain and the source.

In contrast, in the semiconductor device 2 of this embodiment, the first epitaxial layer 16, which has a higher impurity concentration than the buried layer 14, is formed between the buried layer 14 and the base layer 20. With this configuration, because the first epitaxial layer 16 can block the propagation of defect from the buried layer 14, the defects of the buried layer 14 can be prevented from being transferred to the base layer 20. Thus, the generation of a leak current that may occur when a voltage is applied between the drain and source can be reduced.

If the second epitaxial layer 18 is not provided between the first epitaxial layer 16 and the base layer 20, in other words, the first epitaxial layer 16 is in contact with the base layer 20, electric field strength occurs at the boundary between the first epitaxial layer 16 and the base layer 20 when a voltage is applied and the base layer 20 tends to be broken at the back surface side end. In the semiconductor device 2 of this embodiment, the second epitaxial, layer 18, which has a lower impurity concentration than the first epitaxial layer 16, is formed between the first epitaxial layer 16 and the base layer 20. With this configuration, the electric field strength at the back surface end of the base layer 20 can be relaxed and the voltage resistance of the semiconductor device 2 can be improved. Even with this Configuration, the propagation of the defects of the buried layer 14 is blocked by the first epitaxial layer 16, and the transfer of the defects to the second epitaxial layer 18 and the base layer 20 can be reduced.

When the impurity concentrations of the first epitaxial layer 16 and the second epitaxial layer 18 are too high, a breakdown tends to occur in the vicinity of the first epitaxial layer 16 and the second epitaxial layer 18. To avoid this situation, the average of the impurity concentrations of the first epitaxial layer 16 and the second epitaxial layer 18 may be adjusted to be lower than the impurity concentration of the drift layer 12. With this configuration, the voltage resistance of the semiconductor device can be further improved.

Figure 2:
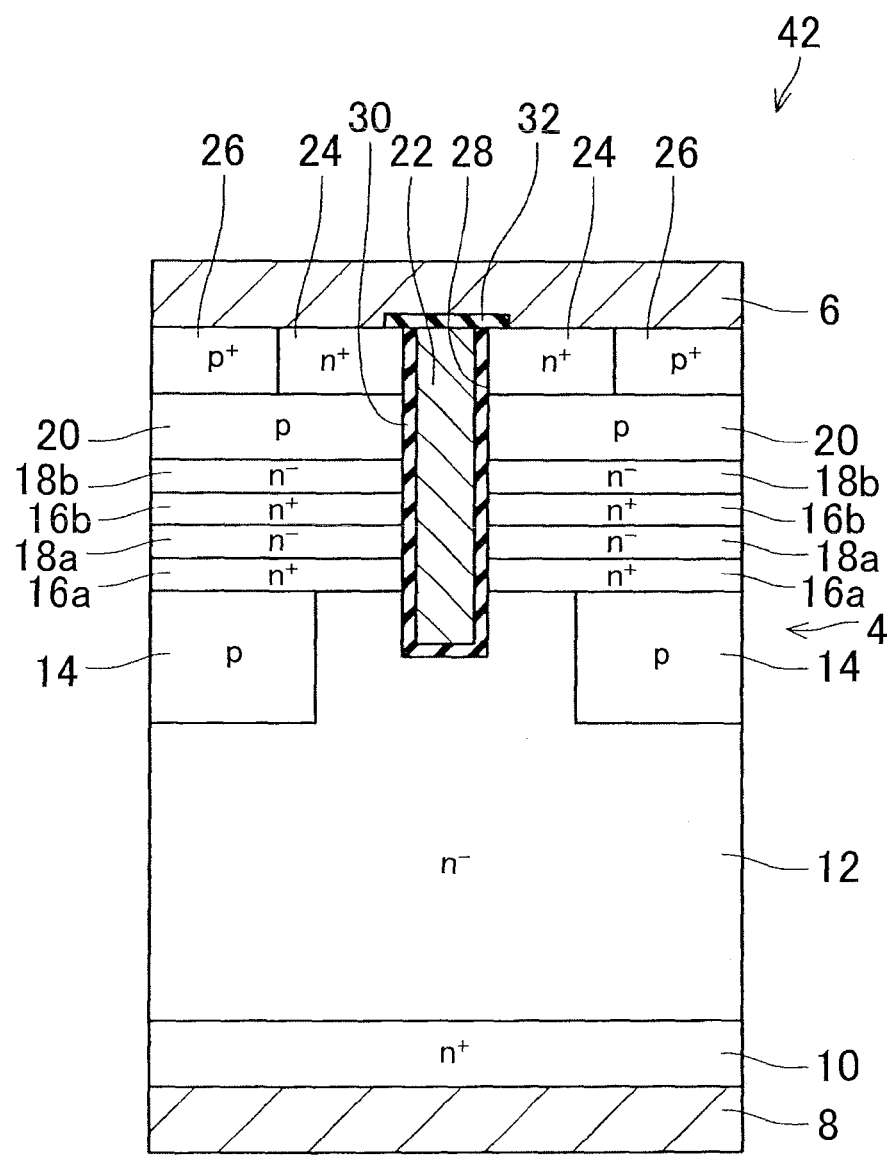
FIG. 2 is across-sectional view that schematically illustrates an essential part of another semiconductor device.

A plurality of pairs of the first epitaxial layer 16 and the second epitaxial layer 18 may be stacked as in a semiconductor device 42 that is shown in FIG. 2. While a case where a pair of a first epitaxial layer 16a and a second epitaxial layer 18a and a pair of a first epitaxial layer 16b and a second epitaxial layer 18b are stacked in succession is shown in the example that is shown in FIG. 2, three or more pairs of the first epitaxial layer 16 and the second epitaxial layer 18 may be stacked. In a configuration in which a plurality of pairs of the first epitaxial layer 16 and the second epitaxial layer 18 is stacked, the average of the impurity concentrations of the paired first epitaxial layer 16b and second epitaxial layer 18b on the side of the front surface of the silicon carbide substrate 4 (in other words, on the side closer to the base layer 20) may be lower than the average of the impurity concentrations of the paired first epitaxial layer 16a and second epitaxial layer 18a on the side of the back surface of the silicon carbide substrate 4 (in other words, on the side closer to the drift layer 12 and the buried layer 14). With this configuration, a depletion layer tends to extend from the boundary with the base layer 20, and the voltage resistance of the semiconductor device 2 can be further improved.

Figure 3:
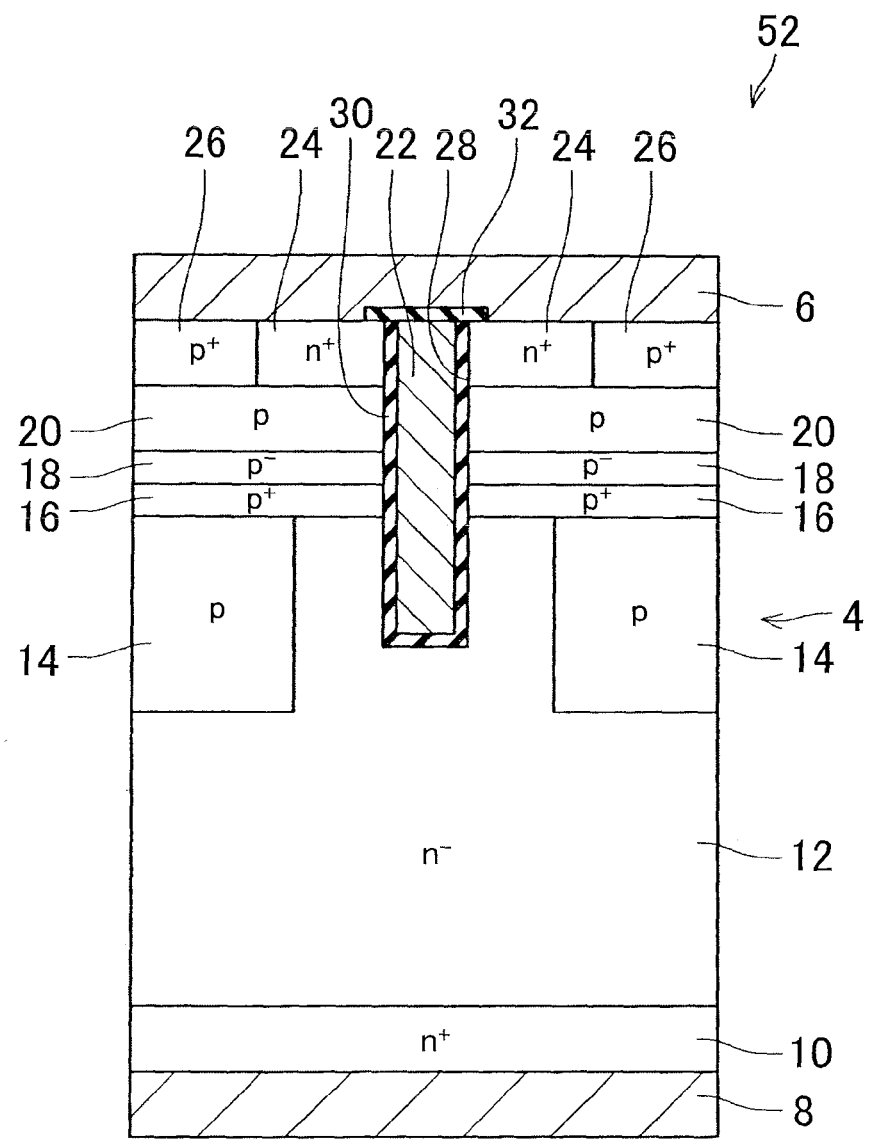
FIG. 3 is a cross-sectional view that schematically illustrates an essential part of another semiconductor device.
Figure 4:
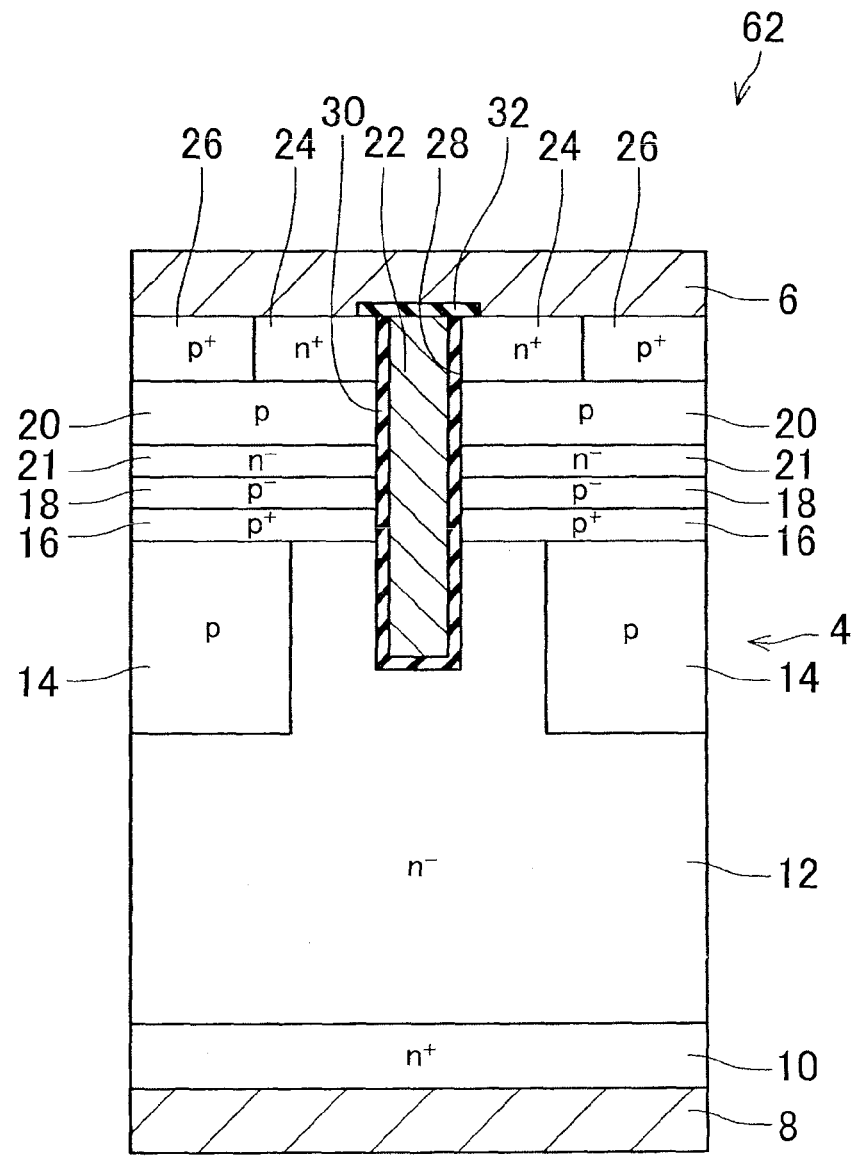
FIG. 4 is a cross-sectional view that schematically illustrates part of another semiconductor device.

While a case where both the first epitaxial layer 16 and the second epitaxial layer 18 are composed of an n-type silicon carbide as in the case with the drift layer 12 is described above, the first epitaxial layer 16 and the second epitaxial layer 18 may be composed of a p-type silicon carbide as in the case with the base layer 20 as in a semiconductor device 52 that is shown in FIG. 3. When such a configuration is employed, it is more preferred that another epitaxial layer (third epitaxial layer) 21 that is composed of an i-type silicon carbide or n-type silicon carbide is formed between the base layer 20, and the first epitaxial layer 16 and the second epitaxial layer 18 in order to prevent a leak current at the boundary with the base layer 20 as in a semiconductor device 62 that is shown in FIG. 4. In the semiconductor device 62 that is shown in FIG. 4, a third epitaxial layer 21 that has a conductivity type different from that of the base layer 20 is provided between the buried layer 14 and the base layer 20. Thus, a leak current that results from defects in the buried layer 14 can be prevented from flowing to the base layer 20.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor device that is formed in a silicon carbide substrate that has a front surface on which a front surface electrode is provided and a back surface on which a back surface electrode is provided, comprising:
   a drain layer that is a first conductivity-type and is electrically connected to the back surface electrode;
   a drift layer that is the first conductivity-type and is placed on the side of the front surface of the silicon carbide substrate relative to the drain layer, the drift layer has a lower impurity concentration than the drain layer;
   a base layer that is a second conductivity-type and is placed on the side of the front surface of the silicon carbide substrate relative to the drift layer, the base layer is electrically connected to the front surface electrode;
   a gate electrode that is placed in a trench that extends from the front surface of the silicon carbide substrate into the drift layer and is insulated from the silicon carbide substrate and the front surface electrode by an insulating film;
   a source layer that is the first conductivity-type and is provided between the base layer and the front surface electrode, the source layer is in contact with the insulating film for the gate electrode and the front surface electrode;
   a buried layer that is the second conductivity-type and is provided between the drift layer and the base layer along a straight vertical line that extends from a front to a back of the semiconductor device, the buried layer is formed such that the depth from the front surface of the silicon carbide substrate to an end thereof on the side of the drift layer is greater than the depth from the front surface of the silicon carbide substrate to a distal end of the trench; and
   a first epitaxial layer that is provided between the buried layer and the base layer, and has a higher impurity concentration than the buried layer,
   wherein the drift layer and the buried layer are both separated from the base layer by the first epitaxial layer, and
   wherein the first epitaxial layer is the first conductivity-type.

2. The semiconductor device according to claim 1, further comprising
   a second epitaxial layer that is provided between the first epitaxial layer and the base layer and has a lower impurity concentration than the first epitaxial layer.

3. The semiconductor device according to claim 2, wherein
   the average of the impurity concentrations of the first epitaxial layer and the second epitaxial layer is lower than the impurity concentration of the drift layer.

4. The semiconductor device according to claim 1, further comprising
   a second epitaxial layer that is provided between the buried layer and the base layer and is a conductivity-type that is different from that of the base layer.

5. The semiconductor device according to claim 1, wherein
the base layer and the first epitaxial layer both contact the insulating film.

* * * * *